United States Patent
Lin et al.

(10) Patent No.: US 8,724,398 B2
(45) Date of Patent: May 13, 2014

(54) NON-VOLATILE SEMICONDUCTOR DEVICE, AND METHOD OF OPERATING THE SAME

(75) Inventors: Chrong-Jung Lin, Hsinchu (TW); Ya-Chin King, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 114 days.

(21) Appl. No.: 13/438,642

(22) Filed: Apr. 3, 2012

(65) Prior Publication Data
US 2012/0257458 A1 Oct. 11, 2012

(30) Foreign Application Priority Data
Apr. 8, 2011 (TW) .............................. 100112245 A

(51) Int. Cl.
*G11C 16/04* (2006.01)
*G11C 16/16* (2006.01)

(52) U.S. Cl.
CPC ..................................... *G11C 16/16* (2013.01)
USPC ............ 365/185.29; 365/185.28; 365/185.27; 365/185.26

(58) Field of Classification Search
CPC ........ G11C 16/16; G11C 16/14; G11C 16/12; G11C 16/10
USPC ............. 365/185.29, 185.28, 185.27, 185.26; 257/288, 214
See application file for complete search history.

(56) References Cited

U.S. PATENT DOCUMENTS

| 5,949,092 | A | * | 9/1999 | Kadosh et al. | 257/67 |
| 6,159,839 | A | * | 12/2000 | Jeng et al. | 438/618 |
| 6,326,270 | B1 | * | 12/2001 | Lee et al. | 438/279 |
| 6,534,818 | B2 | | 3/2003 | Hsu | |
| 2001/0013621 | A1 | * | 8/2001 | Nakazato | 257/314 |
| 2001/0016381 | A1 | * | 8/2001 | Jun | 438/239 |
| 2011/0249500 | A1 | * | 10/2011 | Cha | 365/185.08 |

FOREIGN PATENT DOCUMENTS

TW 201030945 8/2010

* cited by examiner

*Primary Examiner* — Connie Yoha
(74) *Attorney, Agent, or Firm* — Michael A. Glenn; Perkins Coie LLP

(57) ABSTRACT

A non-volatile semiconductor device and a method for operating the same are disclosed, where the non-volatile semiconductor device includes a gate dielectric layer, a n-type floating gate, a coupling gate, a first n-type source/drain, a second n-type source/drain, a first contact plug and a second contact plug. The gate dielectric layer is formed on a p-type semiconductor substrate. The n-type floating gate is formed on the gate dielectric layer. The first n-type source/drain and the second n-type source/drain are formed in the p-type semiconductor substrate. The first and second contact plugs are formed on the first and second n-type source/drains respectively. The coupling gate consists essentially of a capacitor dielectric layer and a third contact plug, where the capacitor dielectric layer is formed on the n-type floating gate, and the third contact plug is formed on the capacitor dielectric layer.

7 Claims, 5 Drawing Sheets

NON-VOLATILE SEMICONDUCTOR DEVICE, AND METHOD OF OPERATING THE SAME

RELATED APPLICATIONS

This application claims priority to Taiwan Application Serial Number 100112245, filed Apr. 8, 2011, which is herein incorporated by reference.

BACKGROUND

1. Technical Field

The present disclosure relates to electronic components, and more particularly, semiconductor components.

2. Description of Related Art

Since the invention of the integrated circuit, the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

In an attempt to further reduce the size of the electronic components and increase stability of the integrated circuit, there is an urgent need in the related field to provide novel electronic components.

SUMMARY

The following presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later.

In one or more various aspects, the present disclosure is directed to a non-volatile semiconductor device, a programmable memory device, a capacitor and a metal oxide semiconductor. These novel electronic components have smaller size compared with the conventional components.

According to one embodiment of the present invention, a non-volatile semiconductor device includes a gate dielectric layer, a n-type floating gate, a coupling gate, a first n-type source/drain, a second n-type source/drain, a first contact plug and a second contact plug. The gate dielectric layer is formed on a p-type semiconductor substrate. The n-type floating gate is formed on the gate dielectric layer. The first n-type source/drain and the second n-type source/drain are formed in the p-type semiconductor substrate and are disposed at opposing sides of the n-type floating gate. The first contact plug is formed on the first n-type source/drain, and the second contact plug is formed on the second n-type source/drain. The coupling gate consists essentially of a capacitor dielectric layer and a third contact plug, where the capacitor dielectric layer is formed on the n-type floating gate, and the third contact plug is formed on the capacitor dielectric layer.

According to another embodiment of the present invention, a method of operating above non-volatile semiconductor device includes steps as follows. A first programming electrical potential is applied to the first conductive plug; a second programming electrical potential is applied to the second conductive plug; a third programming electrical potential is applied to the third conductive plug; a fourth programming electrical potential is applied to the p-type semiconductor substrate, wherein each of the first, second and fourth programming electrical potentials is less than the third programming electrical potential.

Many of the attendant features will be more readily appreciated, as the same becomes better understood by reference to the following detailed description considered in connection with the accompanying drawings.

BRIEF DESCRIPTION OF THE DRAWINGS

The present description will be better understood from the following detailed description read in light of the accompanying drawing, wherein.

DETAILED DESCRIPTION

Figure 1:
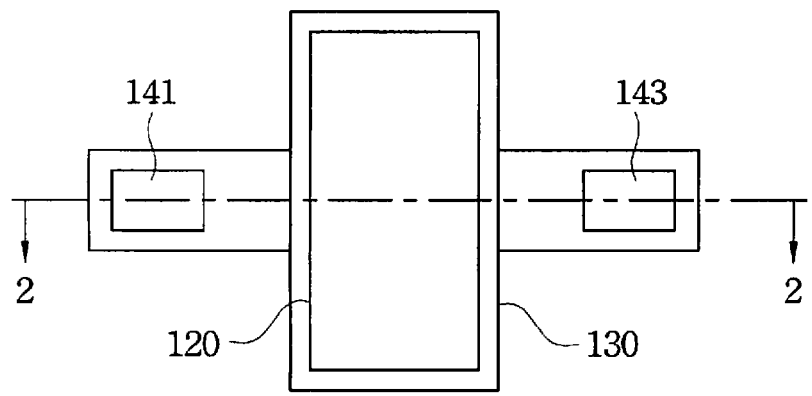
FIG. 1 is a layout view of a non-volatile semiconductor device according to one embodiment of the present disclosure.

In the following detailed description, for purposes of explanation, numerous specific details are set forth in order to attain a thorough understanding of the disclosed embodiments. It will be apparent, however, that one or more embodiments may be practiced without these specific details. In other instances, well-known structures and devices are schematically shown in order to simplify the drawing.

As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used in the description herein and throughout the claims that follow, the source/drain can serve as a source or a drain. The first source/drain serves as the source when the second source/drain serves as the drain; in contrast, the second source/drain serves as the source when the first source/drain serves as the drain.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
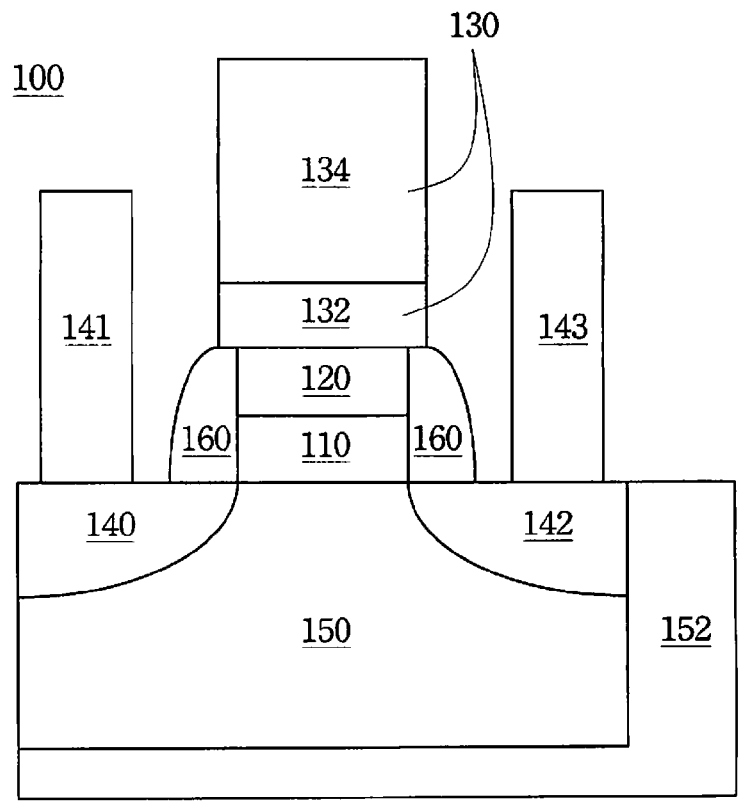
FIG. 2 is a cross-sectional view taken along the line 2-2 in FIG. 1.

FIG. 1 is a layout view of a non-volatile semiconductor device 100 according to one embodiment of the present disclosure; FIG. 2 is a cross-sectional view taken along the line 2-2 in FIG. 1. The non-volatile semiconductor device 100 includes a gate dielectric layer 110, a n-type floating gate 120, a coupling gate 130, a first n-type source/drain 140, a second n-type source/drain 142, a first contact plug 141 and a second contact plug 143.

The gate dielectric layer 110 is formed on a p-type semiconductor substrate 150. The p-type semiconductor substrate 150 may be formed in the n-type deep well 152, so that the p-type semiconductor substrate 150 can be isolated from negative voltage. The n-type floating gate 120 is formed on the gate dielectric layer 110. The first n-type source/drain 140 and the second n-type source/drain 142 are formed in the p-type semiconductor substrate 150 and are disposed at opposing sides of the n-type floating gate 120.

The first contact plug 141 is formed on the first n-type source/drain 140, and the second contact plug 143 is formed on the second n-type source/drain 142. The coupling gate 130 consists essentially of a capacitor dielectric layer 132 and a third contact plug 134, where the capacitor dielectric layer 132 is formed on the n-type floating gate 132, and the third contact plug 134 is formed on the capacitor dielectric layer 132. In use, the first contact plug 141 can be electrically connected to a selection line, the second contact plug 143 can be electrically connected to a bit line, and the third contact plug 134 can act as a control gate electrode.

In this embodiment, the capacitor dielectric layer 132 is in continuous and direct contact with the n-type floating gate 120 and the third contact plug 134 and is disposed between the n-type floating gate 120 and the contact plug 134. Moreover, the spacers 160 are disposed along the outside of the floating gate 120 and the gate dielectric layer 110.

In practice, the gate dielectric layer 110 may be preferably a high-K dielectric material, such as silicon oxide, silicon oxynitride, silicon nitride, an oxide, a nitrogen-containing oxide, a combination thereof, or the like. Preferably, the gate dielectric layer 110 has a relative permittivity value greater than about 4. Other examples of such materials include aluminum oxide, lanthanum oxide, hafnium oxide, zirconium oxide, hafnium oxynitride, or combinations thereof. The floating gate 120 may comprise a conductive material, such as a metal (e.g., tantalum, titanium, molybdenum, tungsten, platinum, aluminum, hafnium, or ruthenium), a metal silicide (e.g., titanium silicide, cobalt silicide, nickel silicide, or tantalum silicide), a metal nitride (e.g., titanium nitride or tantalum nitride), doped poly-crystalline silicon, other conductive materials, or a combination thereof.

In practice, a thickness of the capacitor dielectric layer 132 ranges from 50 Å to 400 Å. If the thickness of the capacitor dielectric layer 132 was less than 50 Å, the voltage breakdown of the capacitor dielectric layer 132 would easily occur, and electric charges would escape from the floating gate 120 through the capacitor dielectric layer 132. If the thickness of the capacitor dielectric layer 132 was greater than 400 Å, the electric coupling of the capacitor dielectric layer 132 would be poor.

In fabrication, the capacitor dielectric layer 132 is a self-aligned silicide blocking layer or a resist protective layer. The material of the capacitor dielectric layer 132 may be SiOx, SiOxNy, SixNy, other conductive materials, or a combination thereof. The spacer 160 may be dielectric material, such as silicon oxide, silicon nitride, a combination thereof, or the like.

In practice, the first contact plug 141, the second contact plug 143 and the third contact plug 134 can be formed simultaneously for simplifying the fabrication processes. In one embodiment, any of aforesaid contact plugs includes a metal plug structure and a barrier layer. The barrier layer is a thin layer (usually micrometers thick) of metal and surrounds the metal plug structure. It is done to act as a "barrier" to protect either one of the metals/electrode from corrupting the other. For example, the barrier layer includes barrier material, which may be selected from the group consisting of titanium nitride, tantalum nitride, indium oxide, copper silicide, tungsten nitride and combinations thereof. For example, the barrier layer 134 comprises one or more layers of titanium nitride, tantalum nitride, or the like. The metal plug structure includes metal that may be tungsten, copper, nickel, aluminum, and combinations thereof, or the like.

For manufacturing the conventional non-volatile memory devices, there is a need of complicated processes. For example, the fabrication of a a double-polysilicon non-volatile memory needs additional and expensive processes, such as an additional doped polysilicon and an additional dielectric layer between the floating and the control gate. In this way, the additional processes introduce more thermal budgets and results in shifting of the characteristic of logic elements. However, an adjustment in the characteristic of logic elements delays the progress of production for a lot of time.

The first contact plug 141, the second contact plug 143, the third contact plug 134 and the capacitor dielectric layer 132, such as the self-aligned silicide blocking layer or the resist protective layer, are manufactured through standard logic processes of semiconductor fabrication. In the present invention, the material of the standard logic processes is utilized to manufacture the non-volatile semiconductor device without additional processes. Thus, the progress of production can be fast, and production costs can be reduced.

Figure 3:
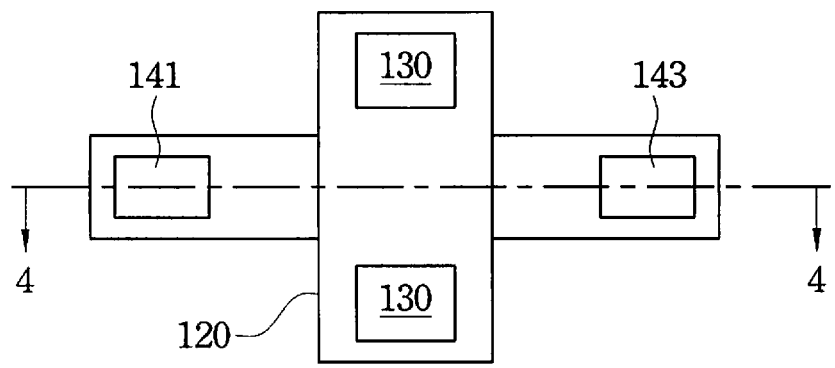
FIG. 3 is a layout view of a non-volatile semiconductor device according to another embodiment of the present disclosure.
Figure 4:
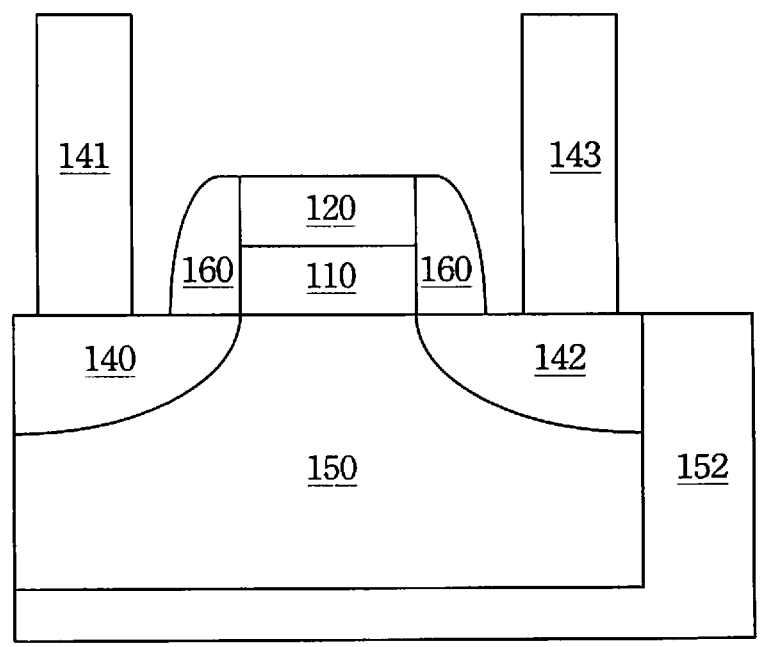
FIG. 4 is a cross-sectional view taken along the line 4-4 in FIG. 1.

FIG. 3 is a layout view of a non-volatile semiconductor device 200 according to another embodiment of the present disclosure; FIG. 4 is a cross-sectional view taken along the line 4-4 in FIG. 1. The non-volatile semiconductor device 200 in structure is substantially the same as the non-volatile semiconductor device 100 except that two separate coupling gates 130 are positioned on the n-type floating gate 120, as shown in FIG. 3. Compared with FIG. 3, FIG. 1 shows a single coupling gate 130 positioned on the n-type floating gate 120.

Compared with conventional art, technical advantages are generally achieved, by embodiments of the non-volatile semiconductor device 100 or 200, as follows:

1. LV Logic Process Compatible;
2. No Extra Mask or Thermal Cycles;
3. Min. Cell size;
4. Single poly process without double poly for making the control gate; and
5. Process cost will be minimized.

For programming the non-volatile semiconductor device 100 or 200, a first programming electrical potential is applied to the first conductive plug 141; a second programming electrical potential is applied to the second conductive plug 143; a third programming electrical potential is applied to the third conductive plug 134; a fourth programming electrical potential is applied to the p-type semiconductor substrate 150, where each of the first, second and fourth programming electrical potentials is less than the third programming electrical potential.

In one embodiment, when the first programming electrical potential is approximately equal to the fourth programming electrical potential, and when each of the first and fourth programming electrical potentials is less than the second programming electrical potential, the non-volatile semiconductor device, such as the non-volatile semiconductor device 100 or 200, is programmed by channel hot electron injection. For example, the first and fourth programming electrical potentials are 0V each, the second programming electrical potential is about 5V, and the third programming electrical potential is about 7V, so that the channel hot electron injection can occur. In this way, the speed of programming the non-volatile semiconductor device is very fast.

Figure 5A:
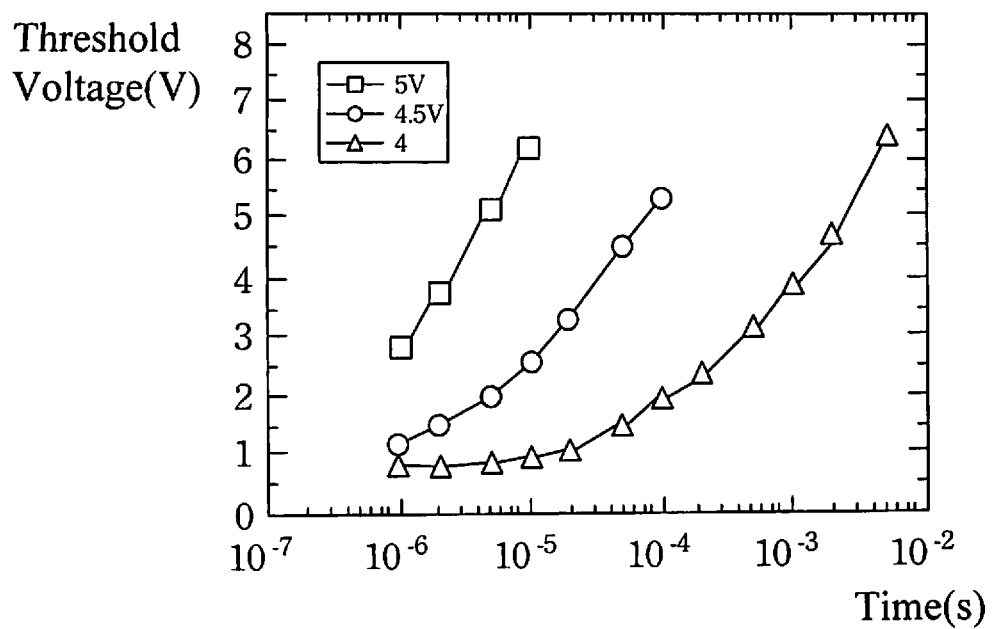
FIGS. 5A and 5B are graphs illustrating a programming process through channel hot electron injection.
Figure 5B:
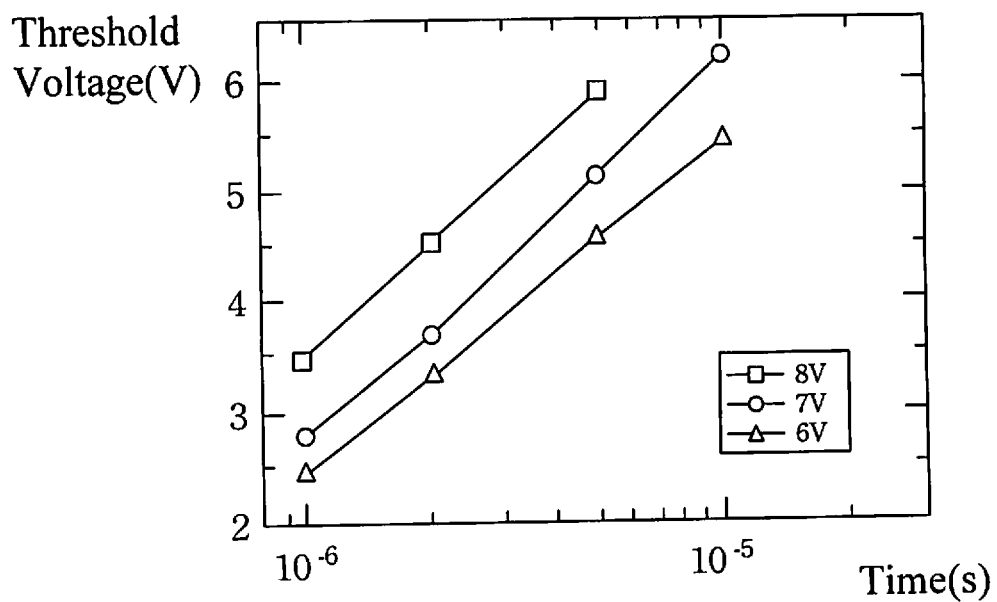

FIGS. 5A and 5B are graphs illustrating a programming process through above channel hot electron injection. FIG. 5A shows a relationship between threshold voltage and time, in which the first and fourth programming electrical potentials are 0V each, the third programming electrical potential is about 7V, and the second programming electrical potential is about 4V, 4.5V or 5V. FIG. 5A shows another relationship between threshold voltage and time, in which the first and fourth programming electrical potentials are 0V each, the second programming electrical potential is about 5V, and the third programming electrical potential is about 6V, 7V or 8V.

In another embodiment, when the fourth programming electrical potential is less than the first programming electrical potential, and when the first programming electrical potential is less than the second programming electrical potential, the non-volatile semiconductor device, such as the non-volatile semiconductor device 100 or 200, is programmed by channel initiated secondary electron. For example, the first programming electrical potential is to greater than 0V and is less than the 2.5V, the second programming electrical potential is about 5V, the third programming electrical potential is about 7V, and the fourth programming electrical potential is about 0V, so that the channel initiated secondary electron can occur. Compared with above channel hot electron injection, the channel initiated secondary electron consumes lower power.

In yet another embodiment, when the first, second and fourth programming electrical potentials are equal to each other, the non-volatile semiconductor device, such as the non-volatile semiconductor device 100 or 200, is programmed by Fowler-Nordheim tunneling. For example, the first, second and fourth programming electrical potentials are 0V each, and the third programming electrical potential is about 20V, so that the Fowler-Nordheim tunneling can occur. Compared with above channel hot electron injection or channel initiated secondary electron, the Fowler-Nordheim tunneling consumes lower power.

Figure 6:
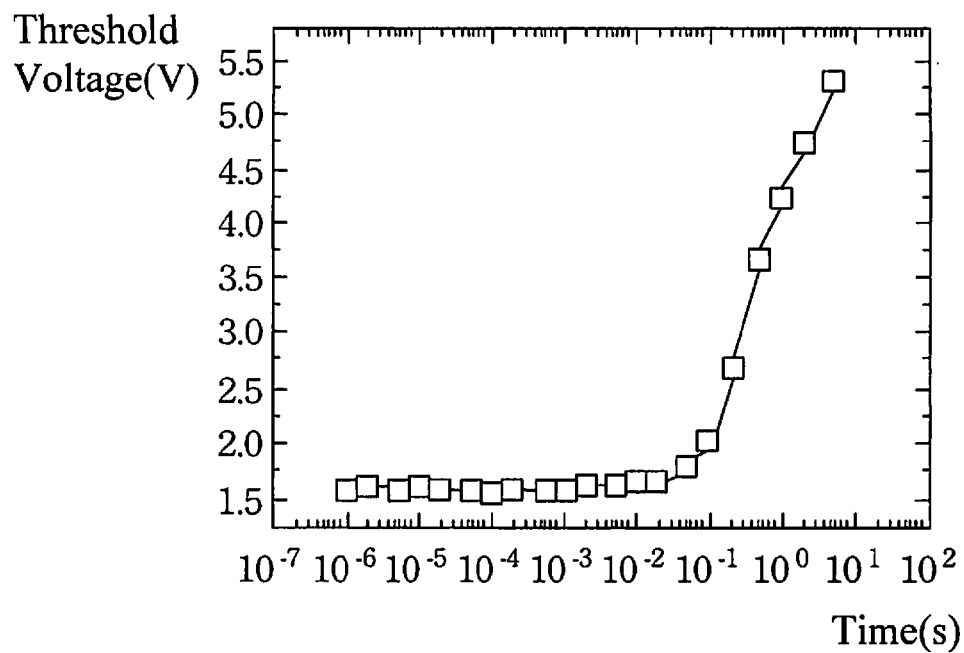
FIG. 6 is a graph illustrating a programming process through Fowler-Nordheim tunneling.

FIG. 6 is a graph illustrating a programming process through Fowler-Nordheim tunneling. In this graph, the relationship between threshold voltage and time is established, in which the first, second and fourth programming electrical potentials are 0V each, and the third programming electrical potential is about 20V.

For erasing the non-volatile semiconductor device 100 or 200, a first erasing electrical potential is applied to the first conductive plug, or floating the first conductive plug, a second erasing electrical potential is applied to the second conductive plug, a third erasing electrical potential is applied to the third conductive plug, and a fourth erasing electrical potential is applied to the p-type semiconductor substrate, where each of the first, second and fourth erasing electrical potentials is greater than the third erasing electrical potential.

In one embodiment, when the first and fourth erasing electrical potentials are approximately equal to each other and are less than the second erasing electrical potential each, or when the first conductive plug 141 is floated and the fourth erasing electrical potential is less than the second erasing electrical potential, the non-volatile semiconductor device, such as the non-volatile semiconductor device 100 or 200, is erased by band to band hot hole injection. For example, the first erasing electrical potential is about 0V, or the first conductive plug 141 is floated, the second erasing electrical potential is greater than about 5V and is less than about 10V, the third erasing electrical potential is greater than about −10V and is less than about −5V, and the fourth erasing electrical potential is about 0V, so that the band to band hot hole injection can occur. In this way, the speed of erasing the non-volatile semiconductor device is very fast.

Figure 7:
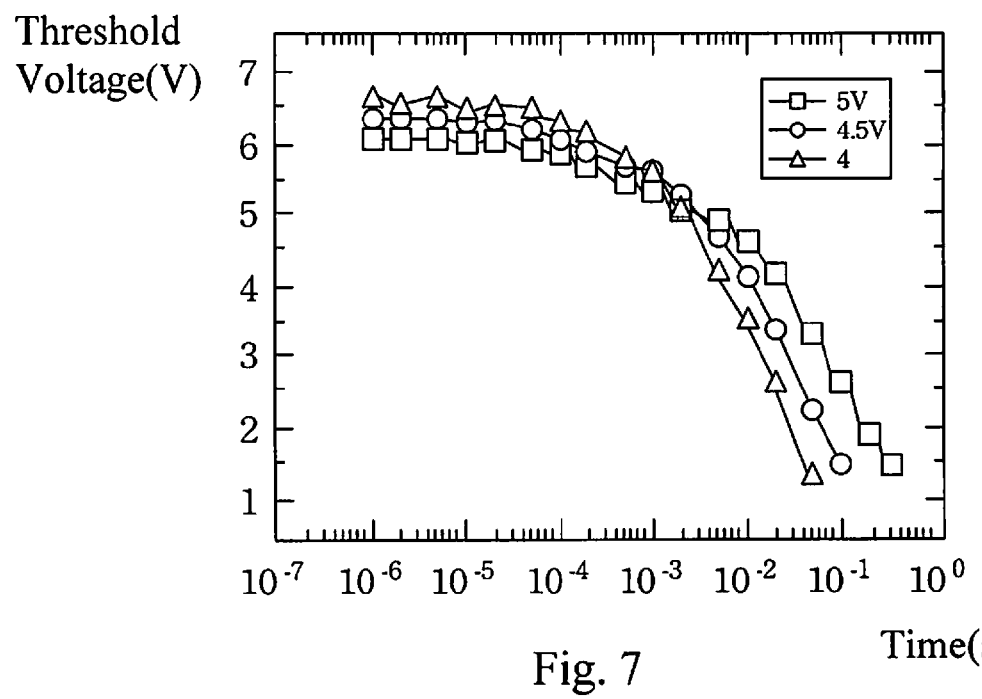
FIG. 7 is a graph illustrating an erasing process through band to band hot hole injection.

FIG. 7 is a graph illustrating an erasing process through above band to band hot hole injection. In this graph, the relationship between threshold voltage and time is established, in which the first erasing electrical potential is about 0V, or the first conductive plug 141 is floated, the second erasing electrical potential is greater than or equal to about 5V, the fourth erasing electrical potential is 0V, and the third erasing electrical potential is about −5V, −6V or −7V.

In another embodiment, when the first, second and fourth erasing electrical potentials are approximately equal to each other, the non-volatile semiconductor device, such as the non-volatile semiconductor device 100 or 200, is erased by Fowler-Nordheim tunneling. For example, the first, second and fourth erasing electrical potentials are 0V each, and the third erasing electrical potential is about −20V, so that the Fowler-Nordheim tunneling can occur. Compared with above band to band hot hole injection, the Fowler-Nordheim tunneling consumes lower power.

Figure 8:
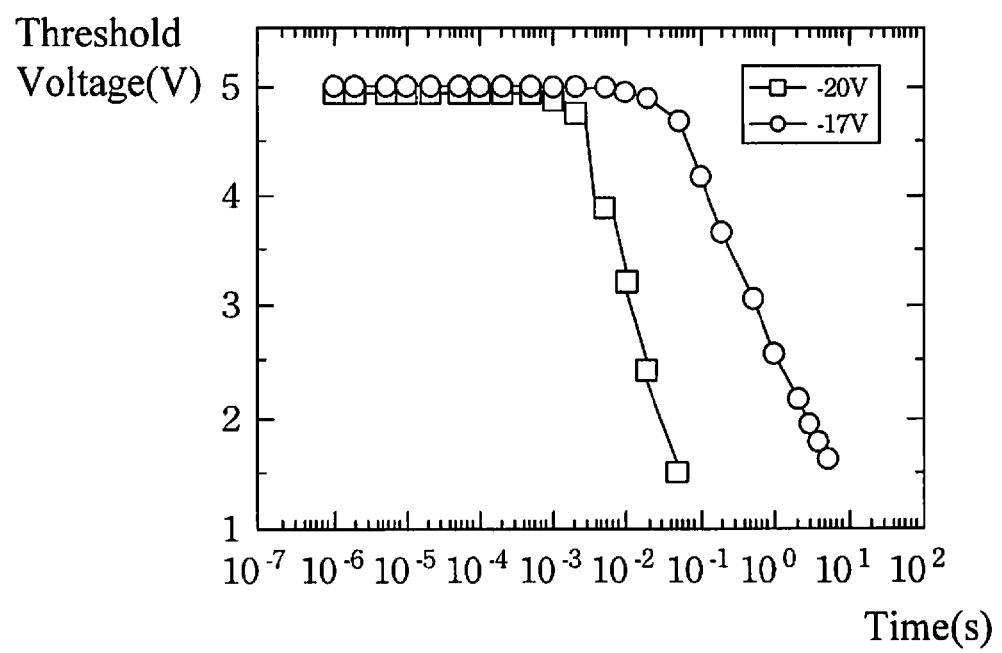
FIG. 8 is a graph illustrating an erasing process through the Fowler-Nordheim tunneling.

FIG. 8 is a graph illustrating an erasing process through the Fowler-Nordheim tunneling. In this graph, the relationship between threshold voltage and time is established, in which the first, second and fourth erasing electrical potentials are 0V each, and the third erasing electrical potential is about −17V or −20V.

For reading the non-volatile semiconductor device 100 or 200, a first reading electrical potential is applied to the first conductive plug 141, a second reading electrical potential is applied to the second conductive plug 143, a third reading electrical potential is applied to the third conductive plug 134, and a fourth reading electrical potential is applied to the p-type semiconductor substrate 150, where the first reading electrical potential is approximately equal to the fourth reading electrical potential, each of the first and fourth reading electrical potentials is less than the second reading electrical potential, and each of the first and fourth reading electrical potentials is less than the third reading electrical potential. In this way, it is determined that the non-volatile semiconductor device is programmed or erased according to the magnitude of the read-out current.

For example, the first reading electrical potential is about 0V, the fourth reading electrical potential is about 0V, the second reading electrical potential is greater than about 0.5V and is less than about 3V. The third reading electrical potential is greater than about 2V and is less than about 5V.

The reader's attention is directed to all papers and documents which are filed concurrently with his specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. A method of operating a non-volatile semiconductor device, the non-volatile semiconductor device comprising a gate dielectric layer formed on a p-type semiconductor substrate; a n-type floating gate formed on the gate dielectric layer; a first n-type source/drain and a second n-type source/drain formed in the p-type semiconductor substrate and disposed at opposing sides of the n-type floating gate; a first contact plug formed on the first n-type source/drain; a second contact plug formed on the second n-type source/drain; and at least one coupling gate consisting essentially of a capacitor dielectric layer and a third contact plug, wherein the capacitor dielectric layer is formed on the n-type floating gate, and the third contact plug is formed on the capacitor dielectric layer, and the method comprising:

applying a first programming electrical potential to the first conductive plug;

applying a second programming electrical potential to the second conductive plug;

applying a third programming electrical potential to the third conductive plug;

applying a fourth programming electrical potential to the p-type semiconductor substrate, wherein each of the first, second and fourth programming electrical potentials is less than the third programming electrical potential;

applying a first reading electrical potential to the first conductive plug;

applying a second reading electrical potential to the second conductive plug;

applying a third reading electrical potential to the third conductive plug; and applying a fourth reading electrical potential to the p-type semiconductor substrate, wherein the first reading electrical potential is approximately equal to the fourth reading electrical potential, each of the first and fourth reading electrical potentials is less than the second reading electrical potential, and each of the first and fourth reading electrical potentials is less than the third reading electrical potential.

2. The method of claim 1, wherein when the first programming electrical potential is approximately equal to the fourth programming electrical potential, and when each of the first and fourth programming electrical potentials is less than the second programming electrical potential, the non-volatile semiconductor device is programmed by channel hot electron injection.

3. The method of claim 1, wherein when the fourth programming electrical potential is less than the first programming electrical potential, and when the first programming electrical potential is less than the second programming electrical potential, the non-volatile semiconductor device is programmed by channel initiated secondary electron.

4. The method of claim 1, wherein when the first, second and fourth programming electrical potentials are equal to each other, the non-volatile semiconductor device is programmed by Fowler-Nordheim tunneling.

5. The method of claim 1, further comprising:

applying a first erasing electrical potential to the first conductive plug, or floating the first conductive plug;

applying a second erasing electrical potential to the second conductive plug;

applying a third erasing electrical potential to the third conductive plug; and applying a fourth erasing electrical potential to the p-type semiconductor substrate, wherein each of the first, second and fourth erasing electrical potentials is greater than the third erasing electrical potential.

6. The method of claim 5, wherein when the first and fourth erasing electrical potentials are approximately equal to each other and are less than the second erasing electrical potential each, or when the first conductive plug is floated and the fourth erasing electrical potential is less than the second erasing electrical potential, the non-volatile semiconductor device is erased by band to band hot hole injection.

7. The method of claim 5, wherein when the first, second and fourth erasing electrical potentials are approximately equal to each other, the non-volatile semiconductor device is erased by Fowler-Nordheim tunneling.

* * * * *